(12) United States Patent
Watanabe et al.

(10) Patent No.: US 7,525,300 B2
(45) Date of Patent: Apr. 28, 2009

(54) CURRENT MEASURING DEVICE AND METHOD

(75) Inventors: Satoshi Watanabe, Kariya (JP); Seiki Sakata, Kariya (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 15 days.

(21) Appl. No.: 11/897,136

(22) Filed: Aug. 28, 2007

(65) Prior Publication Data
US 2008/0125988 A1     May 29, 2008

(30) Foreign Application Priority Data
Aug. 29, 2006    (JP)  ............................ P2006-232677

(51) Int. Cl.
*G01R 33/00*     (2006.01)
(52) U.S. Cl. ............................. 324/117 R; 324/117 H; 324/126
(58) Field of Classification Search .................. None
See application file for complete search history.

(56) References Cited

U.S. PATENT DOCUMENTS 5,041,780 A * 8/1991 Rippel ..................... 324/117 H
5,172,052 A * 12/1992 Wells ...................... 324/117 R

FOREIGN PATENT DOCUMENTS

JP    2003-315377     11/2003
JP    2005-207791      8/2005

* cited by examiner

*Primary Examiner*—Minh N Tang
(74) *Attorney, Agent, or Firm*—Locke Lord Bissell & Liddell, LLP

(57) ABSTRACT

A current measuring device measures the current flowing through each conductor which connects a power supply with a motor. Coreless current sensors are arranged between pairs of the conductors. Coefficients which represent a relationship between a fixed standard current flowing through a conductor and the output signal from coreless current sensors for the fixed standard current are obtained in advance from known measurements. A calculator then determines the current flowing through each conductor based upon the corresponding output signals from the coreless current sensors, the measured coefficients and formula $I_u+I_v+I_w=0$.

8 Claims, 6 Drawing Sheets

CURRENT MEASURING DEVICE AND METHOD

BACKGROUND OF THE INVENTION

The present invention relates to a current measuring device and method. More specifically, the invention relates to a current measuring device and method which measures a current, using a coreless current sensor.

An electrical configuration with a current transformer is used to measure electrical current flowing through a conductor. In this configuration, a magnetic core is used to attract the magnetic flux around the conductor with the current being measured while the conductor is isolated from the current transformer.

However, the current sensor with a magnetic core generates a large amount of heat due to magnetic losses. Furthermore, there are some problems associated with reductions in size, weight and cost.

In order to solve these problems, a current measuring device using a coreless current sensor has been developed. A coreless current sensor measures a current without a magnetic core. As a coreless current sensor, a device (i.e., a hole element) which generates a voltage corresponding to the magnetic-flux density is known.

According to Japanese Unexamined Patent Publication No. 2005-207791, as shown in FIG. 6, four magnetic sensors 22A, 22B, 22C and 22D along with three conductors 21A, 21B and 21C are arranged alternatively at distance r. Each magnetic sensor detects the current flowing through each conductor and outputs a voltage signal corresponding to a magnetic-flux density. Processing part 23 performs a prescribed arithmetic processing for the signals from the magnetic sensors, so that the current flowing through each conductor is obtained. In this case, the influence of external magnetic fields (in other words, magnetic fields which appear according to factors other than the current flowing through the conductors) cancels each other out since the number of the magnetic sensors is greater than that of the conductors.

However, in this configuration, it is difficult to accurately measure the current unless the property of magnetic sensors is uniform, there is equality in the distance r, or external magnetic fields are uniform. Moreover, because the number of magnetic sensors must be greater than that of the conductors, this current measuring device is large in size. In addition, when measuring an alternating current generated by a switching power supply, the noise generated by the switching operation may affect the measurement.

SUMMARY OF THE INVENTION

The present invention is directed to a current measuring device and method for measuring the current flowing through each of three conductors.

In accordance with one embodiment of the present invention, the current measuring device includes first and second coreless current sensors spatially arranged with respect to the conductors. The current measuring device further includes predetermined mathematical coefficients representing a relationship between a fixed standard current and the output signal from the coreless current sensors for the fixed standard current. The current measuring device also includes a calculator for calculating the current flowing through each conductor based upon (i) the corresponding output signals from the coreless current sensors, (ii) the predetermined mathematical coefficients, and (iii) formula $I_u+I_v+I_w=0$, wherein $I_u$ represents the current flowing through the first conductor, $I_v$ represents the current flowing through the second conductor and $I_w$ represents the current flowing through the third conductor.

In accordance with another embodiment of the present invention, the current measuring method includes the step of spatially arranging the first and second coreless current sensors with respect to the conductors. The current measuring method further includes the step of measuring output signals from the coreless current sensors when a fixed standard current flows through each conductor. The current measuring method also includes the step of obtaining predetermined mathematical coefficients representing a relationship between the fixed standard current and the output signal from the coreless current sensors for the fixed standard current. The current measuring method further includes the step of calculating the current flowing through each conductor based upon (i) the corresponding output signals from the coreless current sensors, (ii) the coefficients, and (iii) formula $I_u+I_v+I_w=0$, wherein $I_u$ represents the current flowing through the first conductor, $I_v$ represents the current flowing through the second conductor and $I_w$ represents the current flowing through the third conductor.

It is not intended that the invention be summarized here in its entirety. Rather, other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the embodiments together with the accompanying drawings in which:

DETAILED DESCRIPTION OF THE EMBODIMENTS

The present invention is based on assumption that formula $I_u+I_v+I_w=0$ is satisfied, wherein $I_u$ represents the current flowing through a first conductor, $I_v$ represents the current flowing through a second conductor and $I_w$ represents the current flowing through a third conductor.

A current measuring device and method according to an embodiment of the present invention will now be described with reference to FIGS. 1 through 4. In this embodiment, the current measuring device and method are applied to a three-phase alternating current system wherein a power supply is connected to a motor through three conductors.

Figure 1:
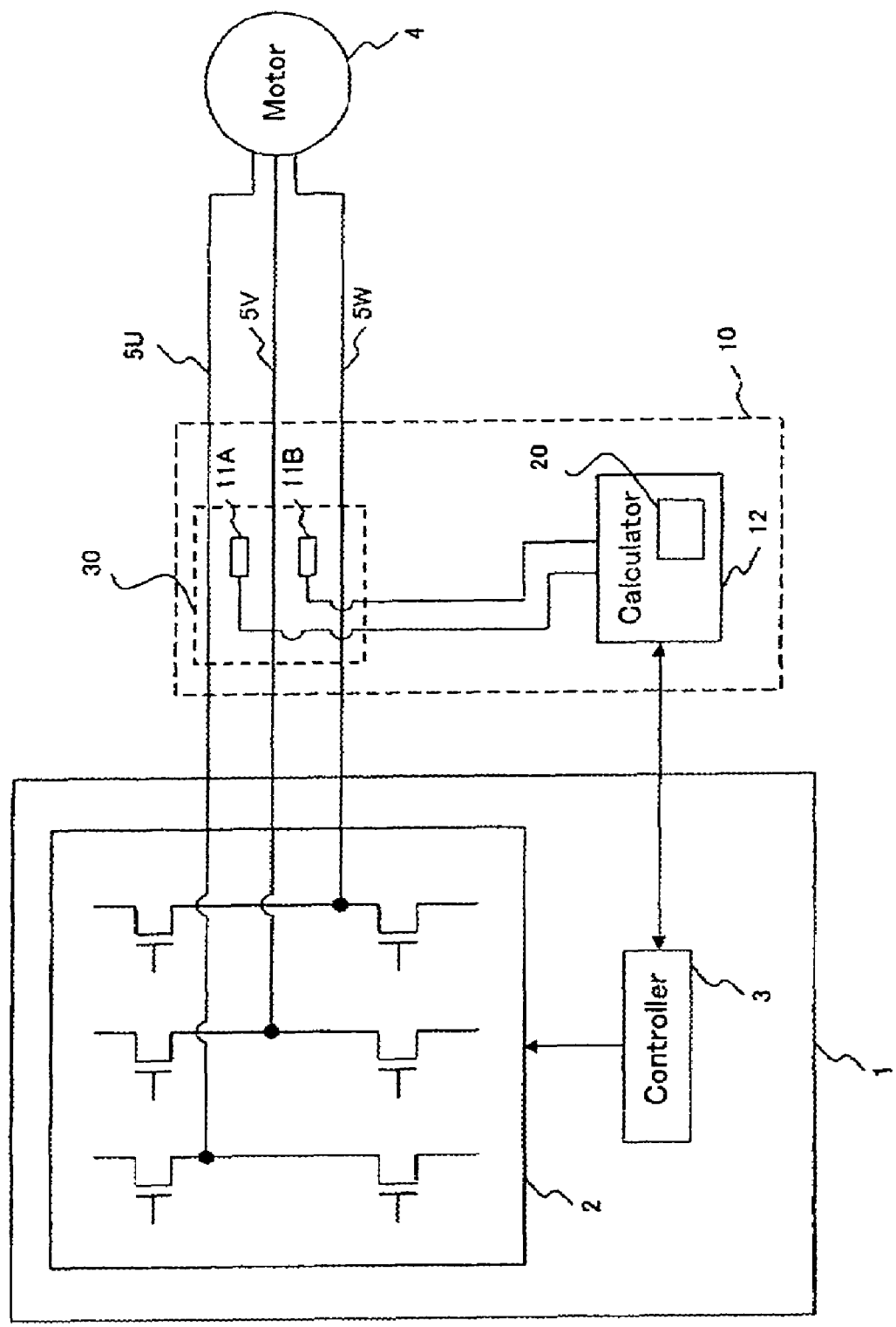
FIG. 1 is a schematic diagram illustrating a current measuring device according to an embodiment of the present invention.

As shown in FIG. 1, a power supply 1 is a switching power supply which includes an inverter 2 and a controller 3 for controlling the inverter 2. The inverter 2 is comprised of a plurality of switching elements. The power supply 1 is connected to a motor 4 through conductors 5U, 5V and 5W and supplies a three-phase alternating current to the motor 4.

A current measuring device 10 is comprised of coreless current sensors 11A and 11B along with a calculator 12 which are used to measure the current flowing through each of conductors 5U, 5V and 5W (i.e., the first, second and third conductors). In this embodiment, each of coreless current sensors 11A and 11B includes, for example, a hall generator and outputs a voltage (an output signal) corresponding to a magnetic-flux density. Preferably, the calculator 12 is a microcomputer which calculates the current flowing through each of conductors 5U, 5V and 5W based upon the corresponding output signals from coreless current sensors 11A and 11B.

Figure 2:
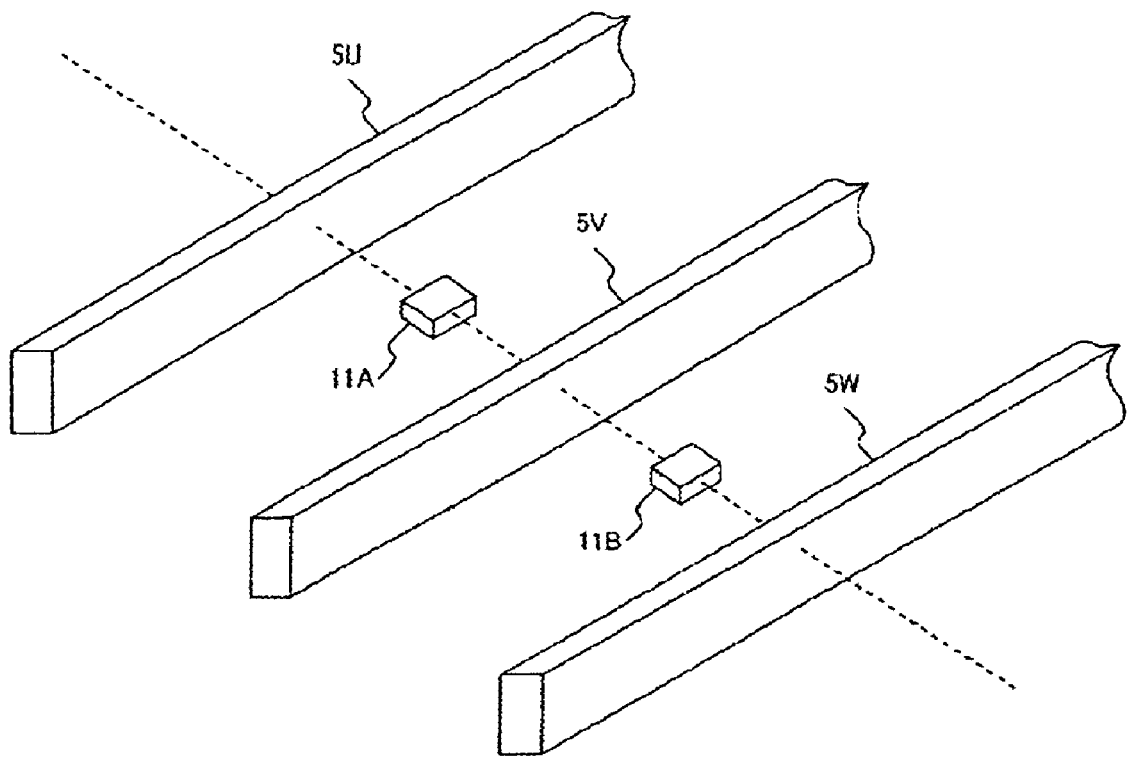
FIG. 2 is a perspective view showing the arrangement of coreless current sensors according to an embodiment of the present invention.

As shown in FIG. 2, conductors 5U, 5V and 5W are bar-shaped and are arranged at equal spatial intervals and in parallel with each other. The current flowing through each conductor typically ranges from a few amperes to several hundred amperes.

Coreless current sensors 11A and 11B are spatially arranged with respect to conductors 5U, 5V and 5W. In this embodiment, that is, coreless current sensor 11A is arranged between conductors 5U and 5V, and coreless current sensor 11B is arranged between conductors 5V and 5W. Preferably, conductors 5U, 5V and 5W along with coreless current sensors 11A and 11B are arranged substantially in the same plane. Furthermore, coreless current sensor 11A is preferentially arranged equidistantly from conductors 5U and 5V and coreless current sensor 11B is arranged equidistantly from conductors 5V and 5W. However, it is not necessary to arrange coreless current sensors 11A and 11B as described above if reduced sensitivity of coreless current sensors 11A and 11B is permitted.

After conductors 5U, 5V and 5W and coreless current sensors 11A and 11B are arranged as described above, conductors 5U, 5V and 5W and coreless current sensors 11A and 11B are permanently affixed with resin. Furthermore, in order to provide shielding from external magnetic fluxes, a shield 30 (as shown in FIG. 1) is placed on the outside of the resin. Preferably, an iron plate is used as the shield 30.

Under the following explanation, the direction from the power supply 1 to the motor 4 is defined as the positive direction.

Preparation

Before the measurement of the current flowing through each of conductors 5U, 5V and 5W, some coefficients which are used in the calculation are obtained and then stored in a memory 20. The memory 20 is a nonvolatile memory 20 or a processor register and is located within the calculator 12. As mentioned above, conductors 5U, 5V and 5W and coreless current sensors 11A and 11B are affixed with resin. Also, conductors 5U, 5V and 5W and coreless current sensors 11A and 11B are covered by the shield 30 so that external magnetic fluxes can be assumed to have no influence.

Generally, when current I flows through a conductor, the magnetic-flux density B having distance r from the conductor is represented by the following formula where $\mu_0$ represents the magnetic permeability:

$$B = \frac{\mu_0}{2\pi} \times \frac{I}{r}.$$

If a magnetic sensor which outputs voltage V in proportion to magnetic-flux density B is used as the coreless current sensor, the magnetic-flux density B is converted to the voltage according to the following formula:

$$V = K_s \times B.$$

In this formula, $K_s$ represents a proportionality constant standing for the sensitivity of the magnetic sensor.

First, fixed standard current $I_{u0}$ is flown through conductor 5U while no current flows through conductors 5V and 5W. Here, the output from the magnetic sensor is proportional to the magnetic-flux density and the magnetic-flux density is, in turn, proportional to the current flowing through conductor 5U. Therefore, output $V_{ua}$ from coreless current sensor 11A and output $V_{ub}$ from coreless current sensor 11B are represented by the following formulas:

$$V_{ua} = K_{ua} \times I_{u0}$$

$$V_{ub} = K_{ub} \times I_{u0}.$$

In these formulas, coefficients $K_{ua}$ and $K_{ub}$ are represented by:

$$K_{ua} = \frac{\mu_0}{2\pi} \times \frac{K_{sa}}{r_{ua}} \text{ and } K_{ub} = \frac{\mu_0}{2\pi} \times \frac{K_{sb}}{r_{ub}}.$$

Figure 3:
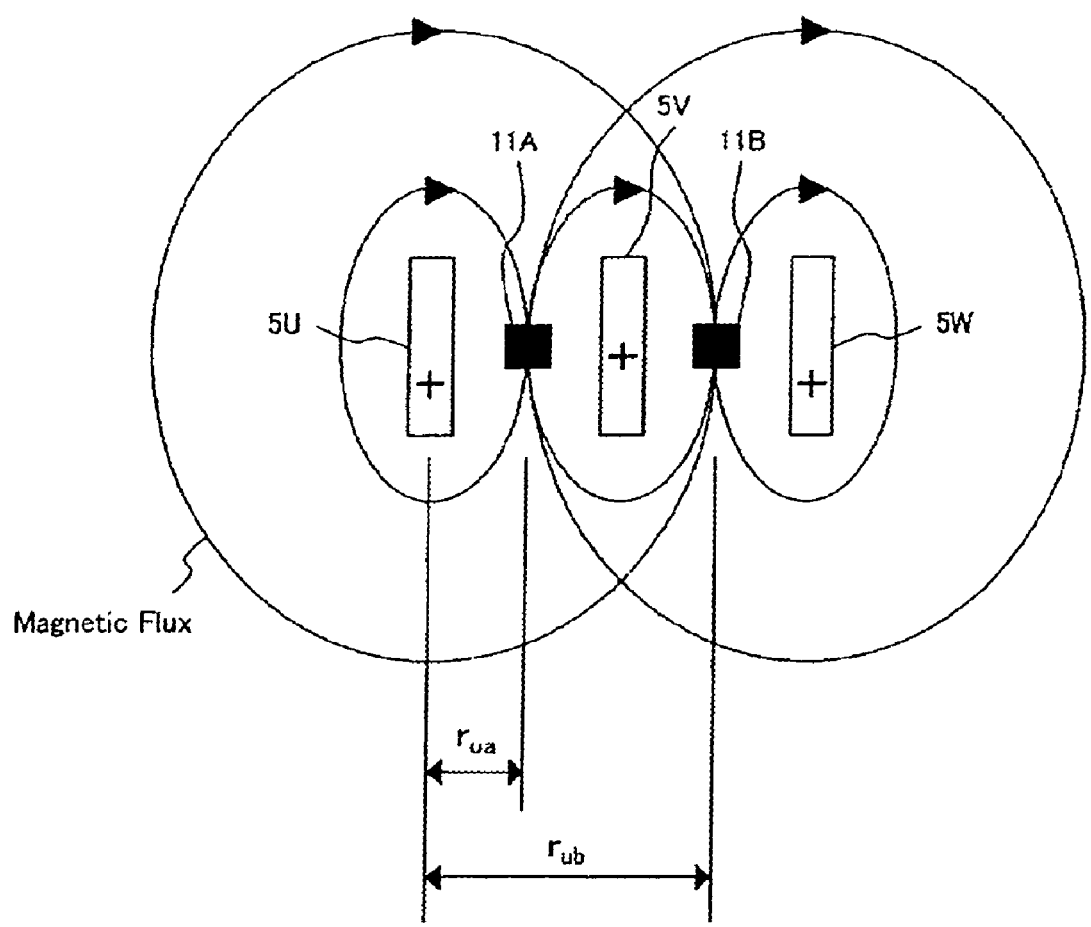
FIG. 3 is an explanatory drawing illustrating a measuring method with the current measuring device according to an embodiment of the present invention.

Coefficient $K_{sa}$ is a constant representing the sensitivity of coreless current sensor 11A, and coefficient $K_{sb}$ is a constant representing the sensitivity of coreless current sensor 11B. As shown in FIG. 3, distance $r_{ua}$ is the distance between conductor 5U and coreless current sensor 11A, and distance $r_{ub}$ is the distance between conductor 5U and coreless current sensor 11B.

As mentioned above, when the fixed standard current $I_{u0}$ flows through conductor 5U, the output of coreless current sensors 11A and 11B is measured so that coefficients $K_{ua}$ and $K_{ub}$ are obtained. According to the above formulas, coefficients $K_{ua}$ and $K_{ub}$ are affected by coefficients $K_{sa}$ and $K_{sb}$ and distances $r_{ua}$ and $r_{ub}$. The sensitivity of coreless current sensors 11A and 11B may have an error based upon an anomaly in manufacturing and distance $r_{ua}$ (or distance $r_{ub}$) may be beyond the proper distance. However, if the output from coreless current sensors 11A and 11B are actually measured, coefficients $K_{ua}$ and $K_{ub}$, which represent a relationship between the current flowing through conductor 5U and the output signal from coreless current sensors 11A and 11B for that current, can be obtained without influence of coefficients $K_{sa}$ and $K_{sb}$ and distance $r_{ua}$ and $r_{ub}$.

Similarly, when fixed standard current $I_{v0}$ flows through conductor 5V only, output $V_{va}$ and $V_{vb}$ which are represented by:

$$V_{va} = K_{va} \times I_{v0} \text{ and}$$

$$V_{vb} = K_{vb} \times I_{v0}$$

are measured. As a result, coefficients $K_{va}$ and $K_{vb}$ which represent a relationship between the current flowing through conductor 5V and the output signal from coreless current sensors 11A and 11B for that current are obtained.

Furthermore, when fixed standard current $I_{w0}$ flows through conductor 5W only, output $V_{wa}$ and $V_{wb}$ which are represented by:

$$V_{wa}=K_{wa} \times I_{w0} \text{ and}$$

$$V_{wb}=K_{wb} \times I_{w0}$$

are measured. As a result, coefficients $K_{wa}$ and $K_{wb}$ which represent a between the current flowing through conductor 5W and the output signal from coreless current sensors 11A and 11B for that current are obtained.

Coefficients ($K_{ua}$, $K_{ub}$, $K_{va}$, $K_{vb}$, $K_{wa}$ and $K_{wb}$) obtained as described above are then stored in the memory 20. The coefficients correspond to calculated mathematical coefficients.

Measurement

When power source 1 supplies electricity for motor 4, calculator 12 reads the output signals from coreless current sensors 11A and 11B, thereby indirectly measuring the current flowing through each of conductors 5U, 5V and 5W. At this time, magnetic fluxes appear based on current $I_u$ flowing through conductor 5U, current $I_v$ flowing through conductor 5V, and current $I_w$ flowing through conductor 5W and affect coreless current sensor 11A and 11B. Thus, output $V_a$ from coreless current sensor 11A is represented by the following formula (1):

$$V_a = K_{ua} \times I_u + K_{va} \times I_v + K_{wa} \times I_w \quad (1)$$

Similarly, output $V_b$ from coreless current sensor 11B is represented by the following formula (2):

$$V_b = K_{ub} \times I_u + K_{vb} \times I_v + K_{wb} \times I_w \quad (2)$$

In these formulas, coefficients ($K_{ua}$, $K_{ub}$, $K_{va}$, $K_{vb}$, $K_{wa}$ and $K_{wb}$) stored in the memory 20 in the preparation step are used.

In this embodiment, power supply 1 supplies a three-phase alternating current to motor 4 and the following formula is satisfied:

$$I_u + I_v + I_w = 0 \quad (3)$$

If $I_v$ is deleted from formula (1) and (2) using formula (3), the following formula (4) and (5) are obtained:

$$V_a = (K_{ua} - K_{va}) \times I_u + (K_{wa} - K_{va}) \times I_w \quad (4)$$

$$V_b = (K_{ub} - K_{vb}) \times I_u + (K_{wb} - K_{vb}) \times I_w \quad (5)$$

Thus, according to formula (4) to (5), current $I_u$ and $I_w$ are represented by:

$$I_u = \frac{(K_{wb} - K_{vb}) \times V_a - (K_{wa} - K_{va}) \times V_b}{(K_{ua} - K_{va}) \times (K_{wb} - K_{vb}) - (K_{ub} - K_{vb}) \times (K_{wa} - K_{va})}$$

and $$I_w = \frac{(K_{ub} - K_{vb}) \times V_a - (K_{ua} - K_{va}) \times V_b}{(K_{ub} - K_{vb}) \times (K_{wa} - K_{va}) - (K_{ua} - K_{va}) \times (K_{wb} - K_{vb})}$$

Furthermore, current $I_v$ is obtained according to formula (3).

As mentioned above, current $I_u$, $I_v$ and $I_w$ flowing through conductors 5U, 5V and 5W respectively can be calculated according to the output signals ($V_a$ and $V_b$) from coreless current sensors (11A and 11B) and six coefficients ($K_{ua}$, $K_{ub}$, $K_{va}$, $K_{vb}$, $K_{wa}$ and $K_{wb}$) which are obtained and then stored in the memory 20 in advance.

Timing of the Measurement

Figure 4:
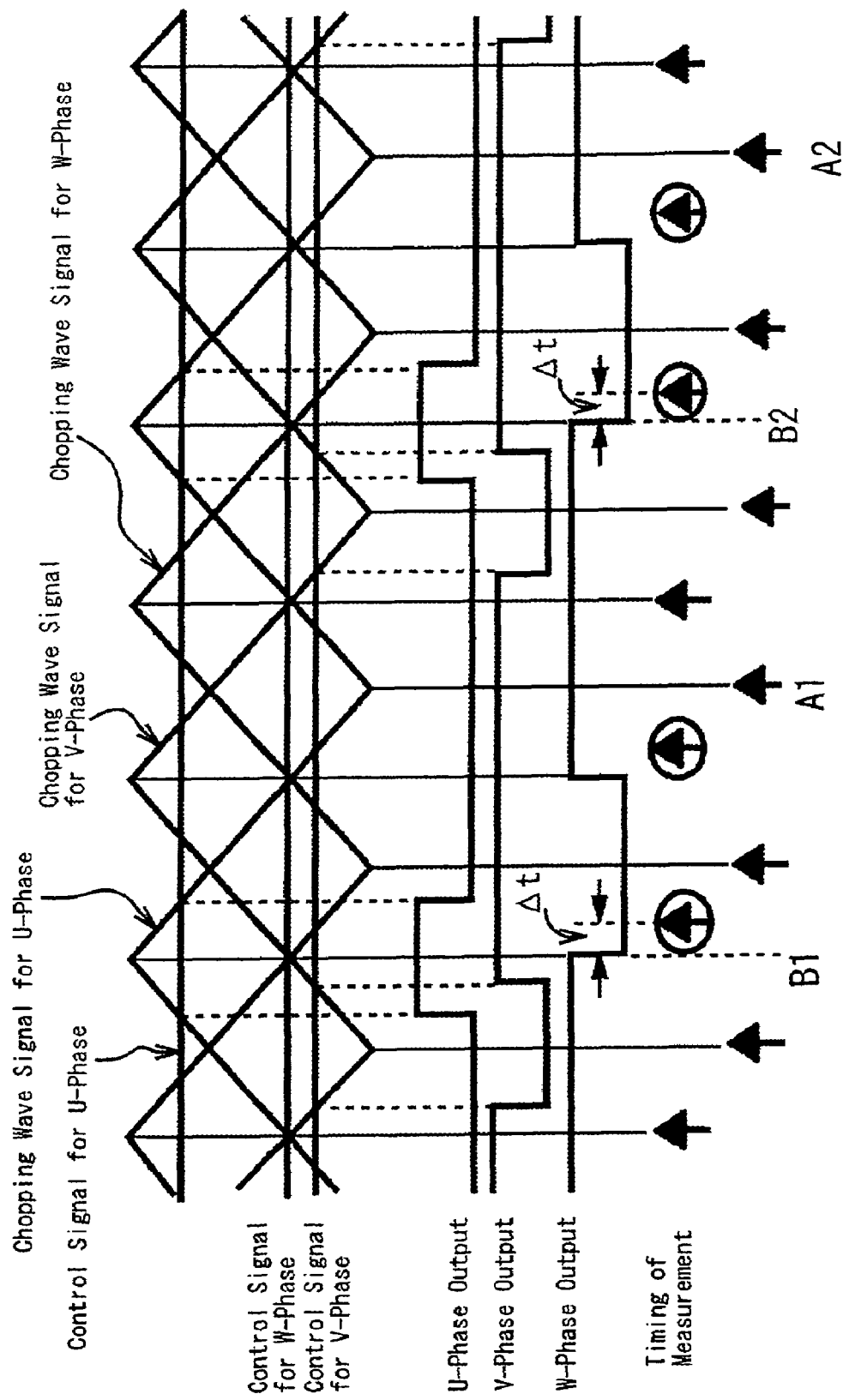
FIG. 4 is a time chart explaining the time of the measurement according to an embodiment of the present invention.

As shown in FIG. 4, inverter 2 is controlled with pulse width modulation control (PWM). The controller 3 compares three chopping wave signals with their respective control signals so that a PWM signal of each phase is generated. Phases of the chopping wave signals shift at 120 degrees to each other. Each chopping wave signal has a constant amplitude and period. The control signal of each phase is generated by a feedback circuit monitoring motor 4.

The controller 3 is a microprocessor and generates PWM signals based upon arithmetic processing. In other words, each chopping wave signal is represented, for example, by a function using the time as a parameter and each control signal is given as digital data. Therefore, controller 3 recognizes switching-time when switching operations are performed on each phase (in other words, when the switching elements turn ON and turn OFF).

The calculator 12 reads the output signals from coreless current sensors 11A and 11B per the switching period of inverter 2. In other words, the current flowing through each of conductors 5U, 5V and 5W is measured per the switching period of inverter 2. In this case, calculator 12 works with controller 3 and reads the output signals from coreless current sensors 11A and 11B when the chopping wave signal of any phase reaches, for example, the peak or off-peak value. For example, if calculator 12 reads the output signals from coreless current sensors 11A and 11B when the U-phase chopping wave signal reaches its off-peak value, calculator 12 reads the output signals at time A1, A2, etc. (as shown in FIG. 4).

Where the time when calculator 12 reads output signals from coreless current sensors 11A and 11B corresponds to the switching-time at power supply 1, calculator 12 shifts the time by Δt. As an example, consider in FIG. 4, where calculator 12 reads the output signals from coreless current sensors 11A and 11B when the U-phase chopping wave signal reaches its peak value, calculator 12 is supposed to read the output signals at time B1, B2, etc. However, the switching operation on the W-phase occurs at time B1 and B2. Therefore, in this case, calculator 12 reads the output signals from coreless current sensors 11A and 11B at a time interval that is shifted by Δt.

In this embodiment, coefficients representing the relationship between the fixed standard current and the output signal from the coreless current sensors for the fixed standard current are obtained in advance. Thus, if formula (3) is used, the current flowing through each of conductors 5U, 5V and 5W can be measured with coreless current sensors 11A and 11B. Furthermore, the number of coreless current sensors 11A and 11B is fewer than that of conductors 5U, 5V and 5W. Therefore, the current measuring device 10 can achieve reductions in size, weight and cost.

In this embodiment, coreless current sensor 11A is arranged between conductors 5U and 5V, and coreless current sensor 11B is arranged between conductors 5V and 5W. Conductors 5U, 5V and 5W along with coreless current sensors 11A and 11B are arranged substantially in the same plane. Therefore, the current measuring device 10 can be smaller in size using the magnetic-flux effectively.

In this embodiment, the current measuring device 10 reads the output signals from coreless current sensors 11A and 11B at the time which differs from the switching-time at the power supply 1. Therefore, the current flowing through each of conductors 5U, 5V and 5W can be measured accurately without the influence of noise generated by switching operation on each phase.

In this embodiment, conductors 5U, 5V and 5W and coreless current sensors 11A and 11B are isolated by the shield 30. Consequently, the influence of external magnetic fields can be avoided.

In the present invention, the following alternative implementations are also encompassed.

Figure 5A:
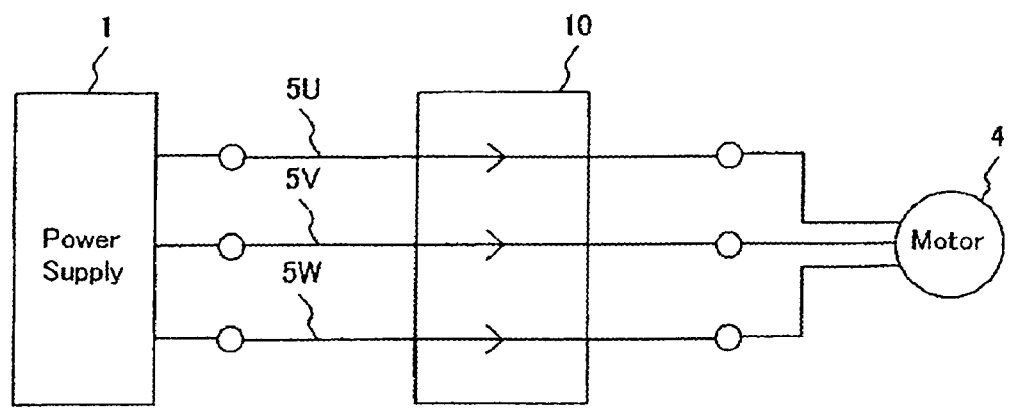
FIG. 5A is another schematic diagram illustrating the current measuring device according to an embodiment of the present invention.
Figure 5B:
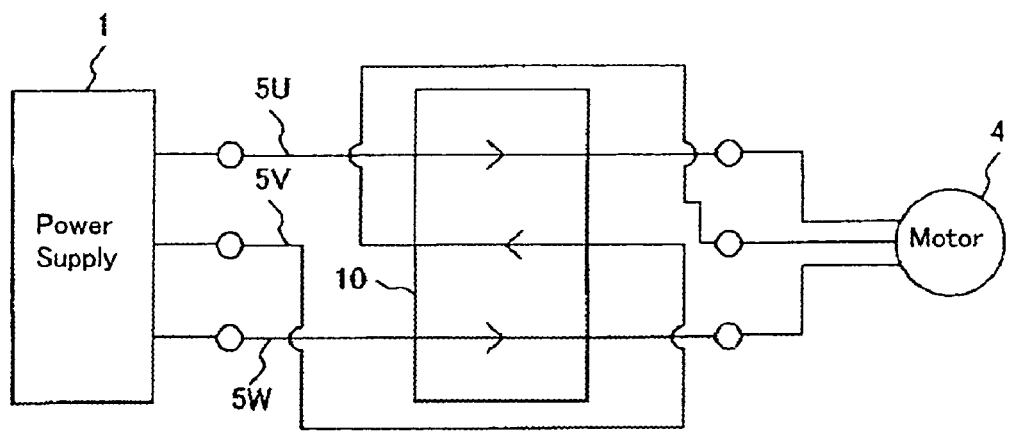
FIG. 5B is a schematic diagram illustrating an alternative implementation of the present invention.
Figure 6:
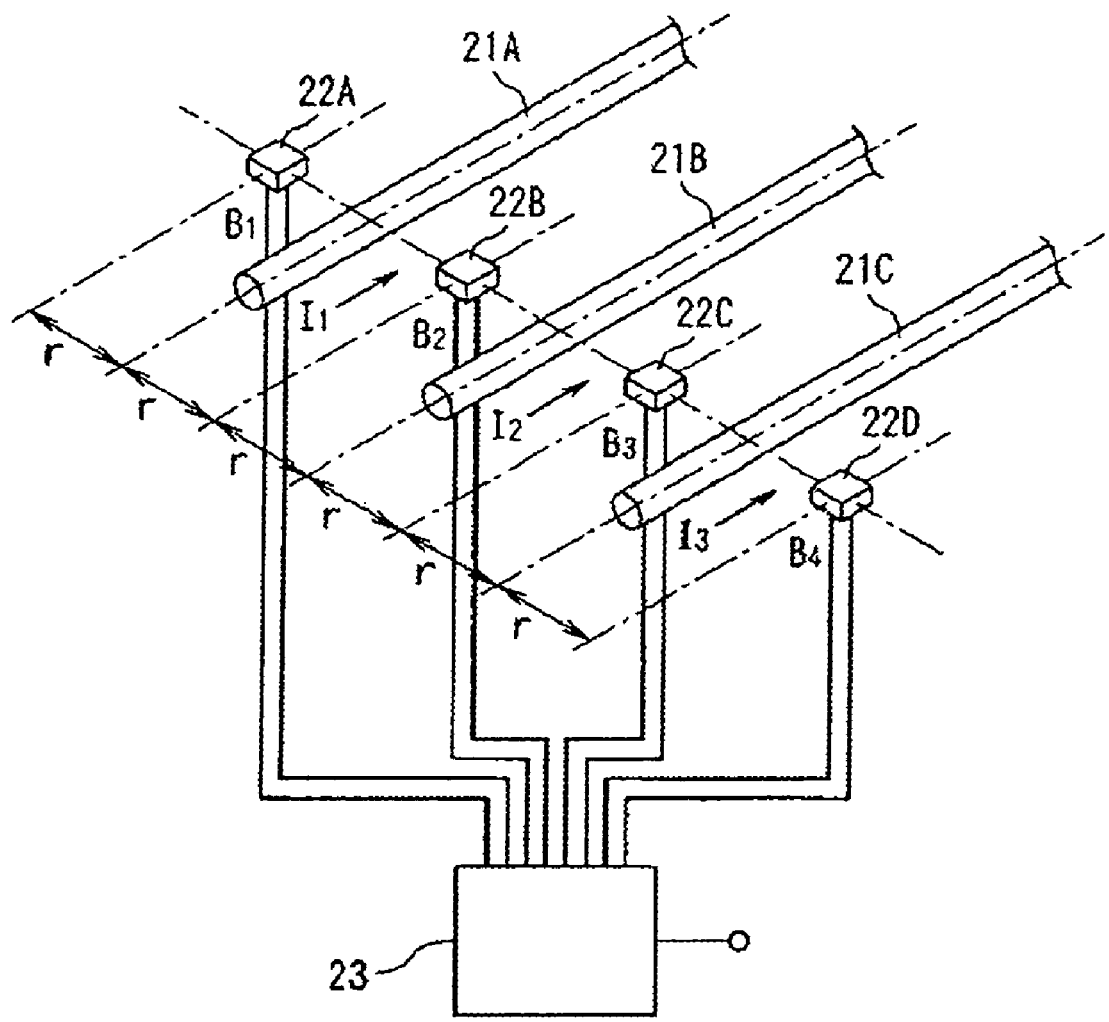
FIG. 6 is a schematic diagram illustrating a conventional current measuring device.

In the above-described embodiment, which is shown in FIG. 5A, the current flowing through each of conductors 5U, 5V and 5W is in phase. In an alternative embodiment, as shown in FIG. 5B, the current flowing through conductor 5V is opposite to the other current flowing through conductors 5U and 5W.

In the above-described embodiment, the current flowing through each of conductors 5U, 5V and 5W which connect the power supply 1 to motor 4, is measured. In an alternative embodiment of the present invention, in an interconnection system which transfers DC power into AC power (50 Hz or 60 Hz) with an inverter and provides for commercial power supply through a system-interconnecting switch, the current flowing through each of the three conductors between the inverter and the system-interconnecting switch is measured. Note that, two of the conductors have, for example, AC voltages of 200 whose phases are opposite to each other, and the other conductor is grounded so that formula (3) is satisfied.

In another embodiment, calculator 12 may include an A/D converter for converting a voltage signal from the coreless current sensors 11A and 11B into a digital signal.

In an alternative embodiment, the microprocessor for controlling the power source 1 may further function as the calculator.

In a further embodiment, $\Delta t$ may be fixed, or be variable taking account to the switching-time when power supply 1 performs switching operation.

In the above-described embodiment, the calculator 12 delayed the time by $\Delta t$. In yet another embodiment, however, the calculator 12 advances the time by $\Delta t$.

Therefore, the present examples and embodiments are to be considered as illustrative and not restrictive and the invention is not to be limited to the details given herein but may be modified within the scope of the appended claims.

This application claims a foreign priority benefit based on Japanese Patent Application No. 2006-232677, filed on Aug. 29, 2006, which is hereby incorporated by reference herein in its entirety as if fully set forth herein.

What is claimed is:

1. A current measuring device for measuring the current flowing through each of three conductors, comprising:
   first and second coreless current sensors are spatially arranged with respect to the conductors; and
   a calculator for calculating the current flowing through each conductor based upon (i) the corresponding output signals from the coreless current sensors, (ii) predetermined mathematical coefficients representing a relationship between a fixed standard current and the output signal from the coreless current sensors for the fixed standard current, and (iii) formula $I_u+I_v+I_w=0$, wherein $I_u$ represents the current flowing through the first conductor, $I_v$ represents the current flowing through the second conductor and $I_w$ represents the current flowing through the third conductor.

2. The current measuring device of claim 1, wherein the first, second, and third conductors are arranged substantially in one plane and parallel to each other with the first coreless current sensor arranged between the first and second conductor and the second coreless current sensor arranged between the second and third conductor.

3. The current measuring device of claim 1, wherein a three-phase alternative current generated by a switching power supply flows through the conductors, the calculator reading the output signals from the coreless current sensors at a time, the time being different from the switching-time when the switching power supply performs switching operation.

4. The current measuring device of claim 1, further comprising
   a shield surrounding the coreless current sensors and the conductors.

5. The current measuring device of claim 1, further comprising
   a memory storing the predetermined mathematical coefficients.

6. The current measuring device of claim 2, wherein the first coreless current sensor is arranged equidistantly from the first and second conductors and the second coreless current sensor is arranged equidistantly from the second and third conductors.

7. A current measuring method for measuring the current flowing through each of three conductors, comprising the steps of:
   spatially arranging first and second coreless current sensors with respect to the conductors;
   measuring output signals from coreless current sensors when a fixed standard current flows through each conductor;
   obtaining predetermined mathematical coefficients representing a relationship between the fixed standard current and the output signal from the coreless current sensors for the fixed standard current; and
   calculating the current flowing through each conductor based upon (i) the corresponding output signals from the coreless current sensors, (ii) the predetermined mathematical coefficients, and (iii) formula $I_u+I_v+I_w=0$, wherein $I_u$ represents the current flowing through the first conductor, $I_v$ represents the current flowing through the second conductor and $I_w$ represents the current flowing through the third conductor.

8. The current measuring method of claim 7, wherein a three-phase alternative current generated by a switching power supply flows through the conductors, the output signals from the coreless current sensors being read at a time, the time being different from the switching-time when the switching power supply performs switching operation.

* * * * *